(12) United States Patent
Okita

(10) Patent No.: US 7,198,960 B2
(45) Date of Patent: Apr. 3, 2007

(54) METHOD FOR FABRICATING FERROELECTRIC CAPACITOR

(75) Inventor: Yoichi Okita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/071,461

(22) Filed: Mar. 4, 2005

(65) Prior Publication Data
US 2005/0153463 A1 Jul. 14, 2005

Related U.S. Application Data

(63) Continuation of application No. PCT/JP03/02212, filed on Feb. 27, 2003.

(51) Int. Cl.
*H01L 21/00* (2006.01)
(52) U.S. Cl. .................... 438/3; 438/250; 438/253; 438/393; 257/E21.664
(58) Field of Classification Search ............. 438/3, 438/238–240, 250–256, 393–399, 381
See application file for complete search history.

(56) References Cited

U.S. PATENT DOCUMENTS

2003/0062563 A1 4/2003 Okita

2005/0098815 A1* 5/2005 Okita et al. ................ 257/306

FOREIGN PATENT DOCUMENTS

| JP | 3-76158 | 4/1991 |
| JP | 2002-289793 | 10/2002 |
| JP | 2002-324852 | 11/2002 |

OTHER PUBLICATIONS

Patent Abstracts of Japan, Publication No. 2002009256 A, published on Jan. 11, 2002.

* cited by examiner

*Primary Examiner*—H. Jey Tsai
(74) *Attorney, Agent, or Firm*—Westerman, Hattori, Daniels & Adrian, LLP.

(57) ABSTRACT

A method for fabricating a ferroelectric memory having memory cells arranged in arrays, wherein an $Al_2O_3$ film (2), a Pt film (3), a PZT film (4) and $IrO_2$ film (5) are formed on an interlayer insulation film. At the time of forming a top electrode, the $IrO_2$ film (5) is patterned using a resist mask having a part extending in the row direction, and then patterned using a resist mask having a part extending in the column direction. Consequently, a top electrode of the $IrO_2$ film (5) having a rectangular plan view is formed at the intersection of these resist masks.

20 Claims, 14 Drawing Sheets

METHOD FOR FABRICATING FERROELECTRIC CAPACITOR

This application is a continuation of international application PCT/JP03/02212 filed on Feb. 27, 2003.

TECHNICAL FIELD

The present invention relates to a method for fabricating a ferroelectric capacitor suitable for a ferroelectric memory and so forth.

BACKGROUND ART

In a ferroelectric memory, plural pieces of memory cells are arranged in a matrix form, and each one of the memory cells is provided with a ferroelectric capacitor. Further, the ferroelectric capacitors are divided into those of a stack type and those of a planar type, of which the planar-type ferroelectric capacitor sometimes has a plate line commonly used for a group of top electrodes in plural lines.

FIGS. 10A and 10B to FIGS. 13A and 13B are views showing a conventional method for fabricating a ferroelectric capacitor in the order of steps. Here, the FIGS. 10A, 11A, 12A, and 13A are top views, and FIGS. 10B, 11B, 12B, and 13B are sectional views taken along the I—I line in FIGS. 10A, 11A, 12A, and 13A, respectively.

In the conventional fabricating method, first, field-effect transistors (not shown) are formed on a semiconductor substrate (not shown). Next, an interlayer insulation film 101 covering respective transistors are formed. Next, as shown in FIGS. 10A and 10B, a bottom electrode film (material film for a bottom electrode) 103, a ferroelectric film 104, and a top electrode film (material film for a top electrode) 105 are sequentially formed on the interlayer insulation film 101. After that, the same number of resist masks 111 intended for etching a top electrode as of the top electrodes to be formed are formed on the top electrode film 105. At this time, the shapes of the resist masks 111 intended for etching a top electrode are made to match with the design planar shapes (rectangle) of the individual top electrodes. However, at the time of a photography to form the resist masks 111, the four corners of the respective resist masks 111 are curved due to a lack of contrast, as shown in FIG. 10A.

Subsequently, the top electrode film 105 is patterned using the resist masks 111 intended for etching a top electrode, and the resist masks 111 intended for etching a top electrode are removed thereafter.

Next, a resist mask (not shown) intended for etching a ferroelectric film is formed on the top electrode film 105. Then, the ferroelectric film 104 is etched using the resist mask intended for etching a ferroelectric film, and the resist mask intended for etching a ferroelectric film is removed thereafter, as shown in FIGS. 12A and 12B.

Subsequently, as shown in FIGS. 13A and 13B, a resist mask 112 intended for etching a bottom electrode is formed on the top electrode film 105, the ferroelectric film 104, and the bottom electrode film 103. Then, the bottom electrode 103 is etched using the resist mask 112 intended for etching a bottom electrode, and the resist mask 112 intended for etching a bottom electrode is removed thereafter, as shown in FIGS. 14A and 14B.

The ferroelectric capacitor is thus fabricated.

However, in such a conventional fabricating method, as described above, there are generated curbed portions at the four corners of the resist mask 111 intended for etching a top electrode, causing the top electrode to be small as compared to the design value. For instance, when the resist mask 111 intended for etching a top electrode is made from an i-ray resist having a square of a 1 μm side, then the pattern becomes smaller than the design value by approximately 10%. Such a loss of area becomes remarkable as the integration degree is improved to thereby downsize the top electrode in the future, so that the loss results in an obstacle to improve the integration degree.

(Patent Document 1)
Japanese Patent Application Laid-Open No. 2002-009256.

SUMMARY OF THE INVENTION

It is an object of the present invention to provide a method for fabricating a ferroelectric capacitor by which a highly-integrated and wide-area top electrode can be formed easily.

In a method for fabricating a ferroelectric capacitor according to the present invention, first, a first conductive film, a ferroelectric film, and a second conductive film are sequentially formed on a base film. Next, the second conductive film is etched twice or more using mutually different masks to thereby be shaped into a rectangle planar shape of a top electrode having the rectangle planar shape. At this time, as a first mask being any one of the mutually different masks, a mask that, in plan view, extends in a first direction being in parallel with any pair of parallel sides of the rectangle and includes a portion covering a region of the second conductive film to form the top electrode is used. In addition, as a second mask being any one of the other mutually different masks, another mask that, in plan view, extends in a second direction being orthogonal to the first direction and includes a portion covering the region of the second conductive film to form the top electrode is used.

DETAILED DESCRIPTION OF THE PREFERRED EMBODIMENTS

Figure 7A:
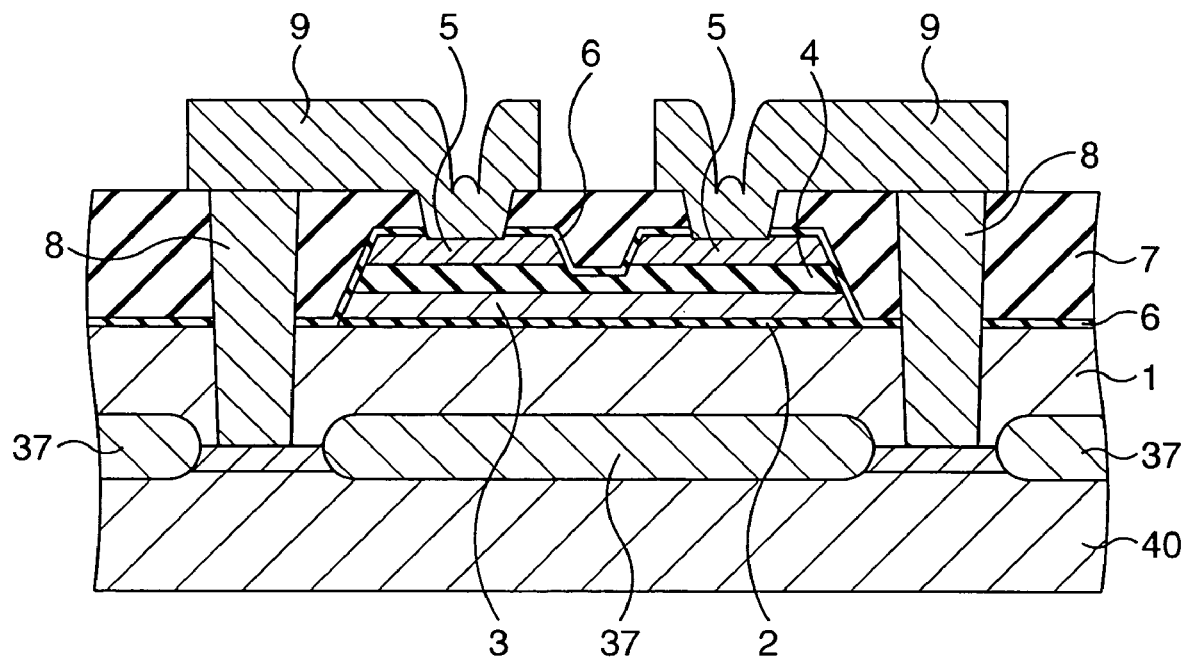
FIGS. 7A and 7B are sectional views showing a configuration of a memory cell of a ferroelectric memory.
Figure 7B:
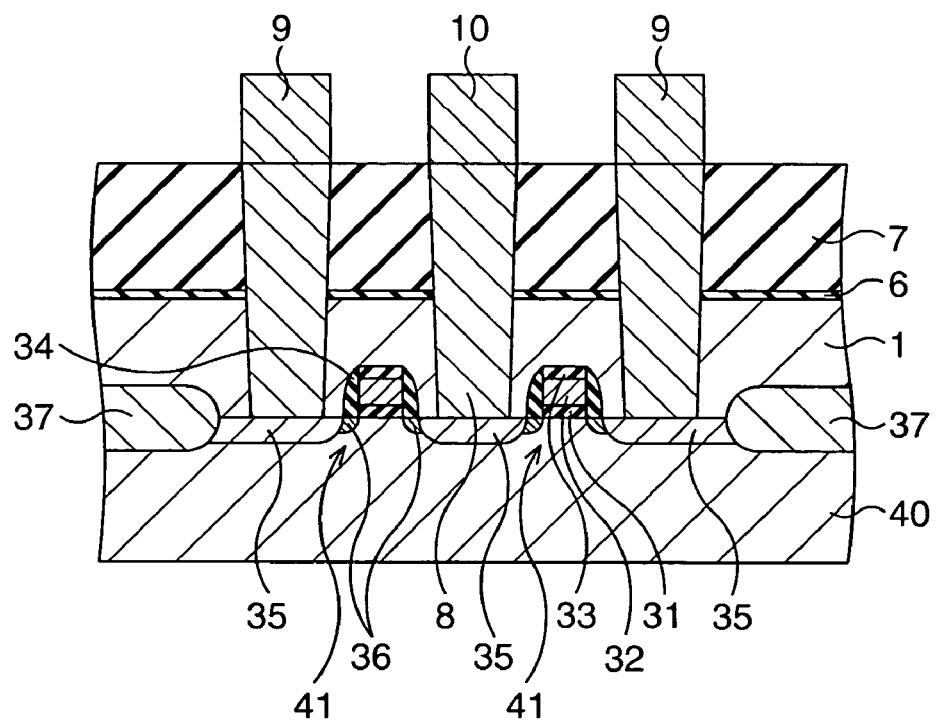
Figure 8:
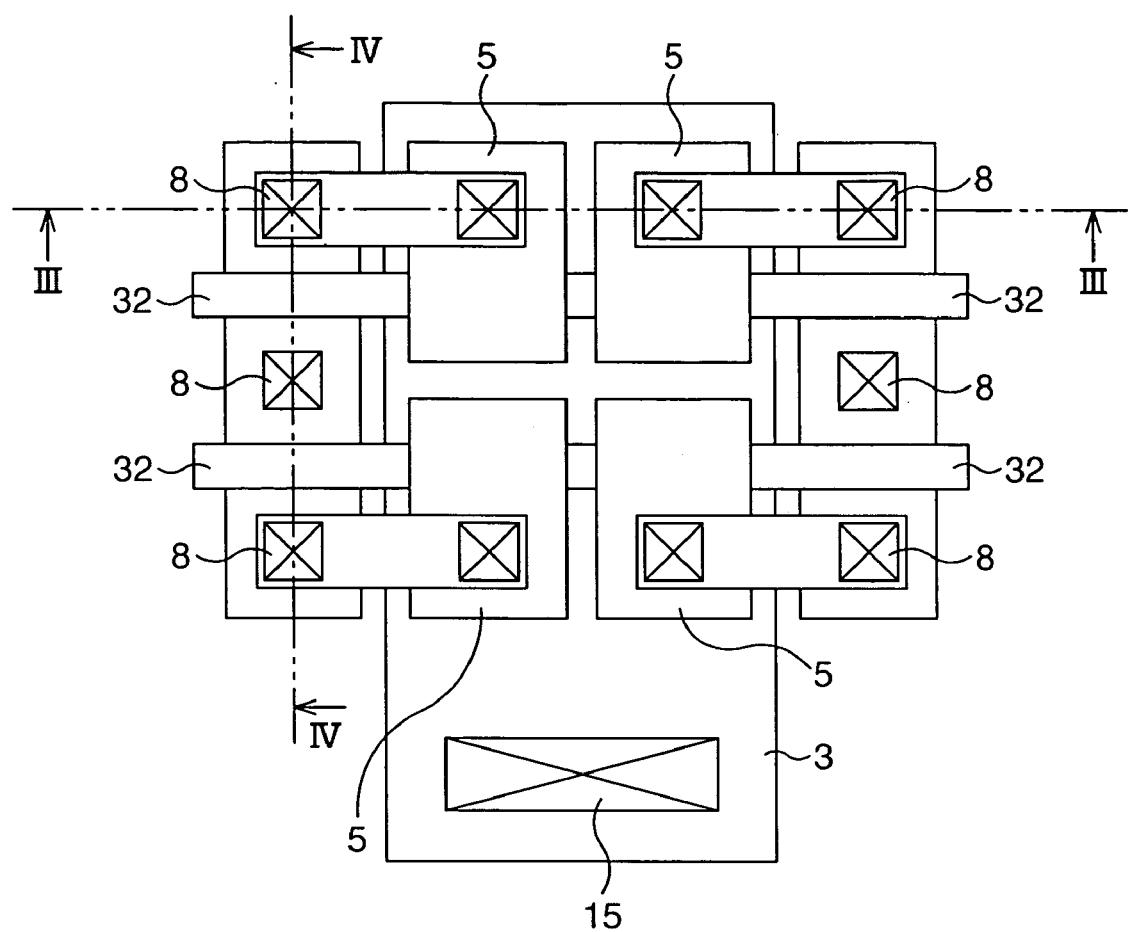
FIG. 8 is a layout showing the relation between electrodes.

Hereinafter, an embodiment according to the present invention will be described specifically with reference to the attached drawings. FIGS. 1A and 1B to FIGS. 6A and 6B are views showing a method for fabricating a ferroelectric memory having a ferroelectric capacitor according to the present invention. Here, FIGS. 1A, 2A, 3A, 4A, 5A and 6A are top views, and FIGS. 1B, 2B, 3B, 4B, 5B and 6B are sectional views showing sections taken along the I—I lines in FIGS. 1A, 2A, 3A, 4A, 5A and 6A, respectively. In addition, FIGS. 7A and 7B are sectional views showing a configuration of a memory cell of the ferroelectric memory. FIG. 8 is a layout showing the relation between electrodes, and FIGS. 7A and 7B correspond to sectional views showing sections taken along the III—III line and the IV—IV line in FIG. 8, respectively.

In the present embodiment, as a memory, a ferroelectric memory in which planar-type memory cells each having 1T1C (a single transistor and a single capacitor) are arranged in arrays is fabricated. A top electrode of the ferroelectric capacitor is designed to have a rectangular planar shape (including square shape). In the description below, in the memory cell array, the direction to which a word line extends is referred to as a row direction and the direction orthogonal thereto is referred to as a column direction.

First, field-effect transistors 41 (see FIG. 7B) are formed on the surface of a semiconductor substrate 40 (see FIGS. 7A and 7B). Then, an interlayer insulation film 1 covering the respective field-effect transistors 41 is formed.

Figure 1A:
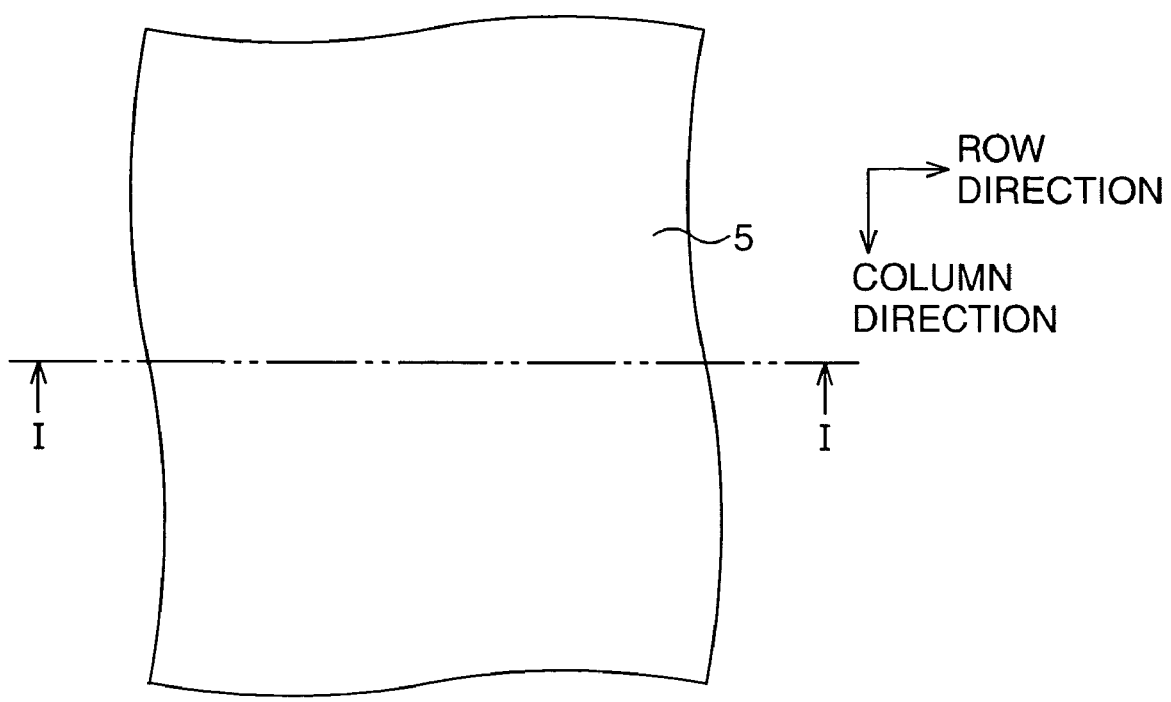
FIGS. 1A and 1B are a top view and a sectional view respectively showing a method for fabricating a ferroelectric memory having ferroelectric capacitors according to an embodiment of the present invention.
Figure 1B:
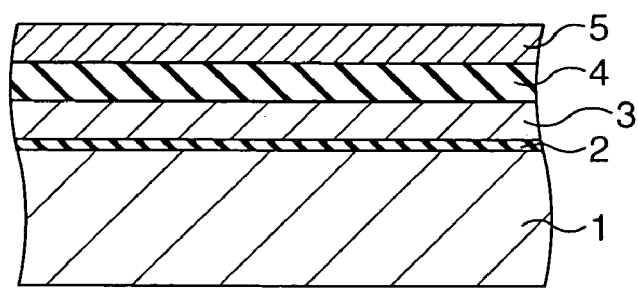

Next, as shown in FIGS. 1A and 1B, an $Al_2O_3$ film 2, a Pt film 3 (first conductive film), a PZT (Pb (Zr, Ti) $O_3$) film 4 (ferroelectric film), and an $IrO_2$ film 5 (second conductive film) are sequentially formed on the interlayer insulation film 1. The $Al_2O_3$ film 2, the Pt film 3, the PZT film 4, and the $IrO_2$ film 5 have a thickness for example of 50 nm, 150 nm, 200 nm, and 250 nm, respectively.

Figure 2A:
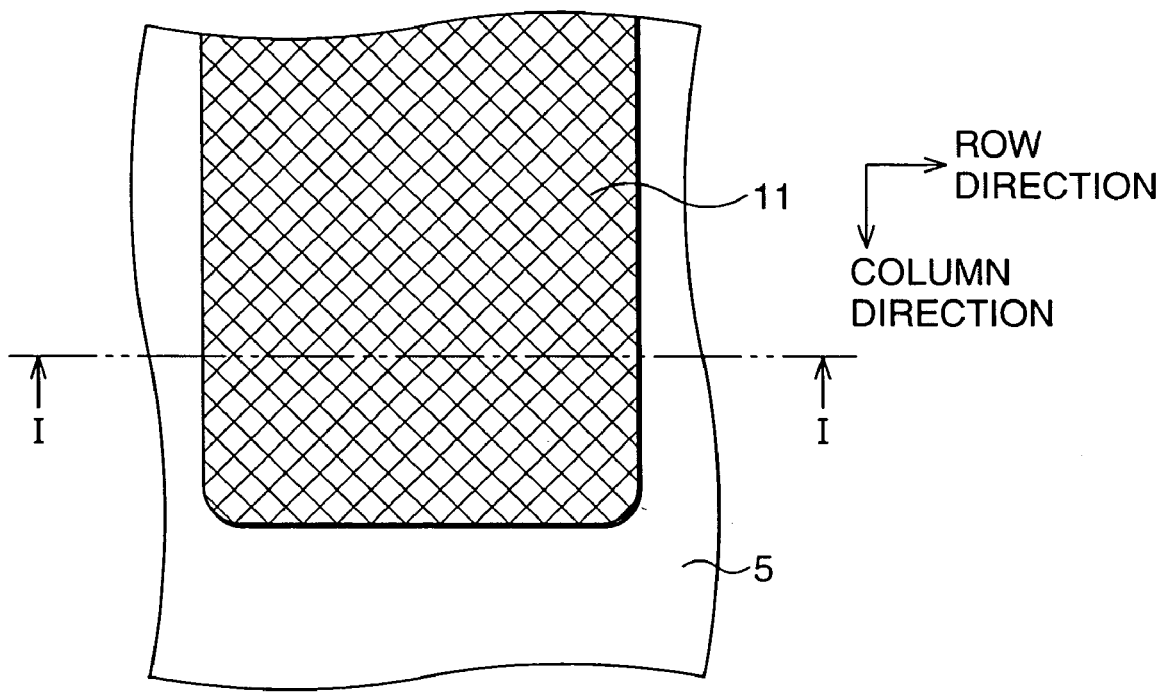
FIGS. 2A and 2B are the top view and the sectional view respectively showing the method for fabricating a ferroelectric memory having ferroelectric capacitors following FIGS. 1A and 1B.
Figure 2B:
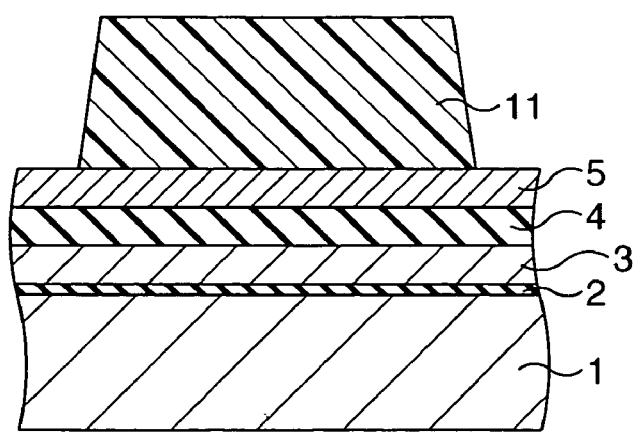

After that, as shown in FIGS. 2A and 2B, a resist mask 11 intended for defining capacitors (third mask) is formed on the $IrO_2$ film 5. At this time, the shape and size of the resist mask 11 for defining capacitors shall satisfy the following three conditions.

(1) Firstly, the resist mask 11 for defining capacitors shall cover all the two columns of top electrodes composing two columns of memory cells adjacent to each other in the row direction (first direction) and entire region between these two columns of electrodes.

(2) Secondly, both the end portions in the row direction of the resist mask 11 for defining capacitors shall be outside the outer side edges of the two columns of top electrodes in plan view.

(3) Thirdly, both the end portions in the column direction (second direction) of the resist mask 11 for defining capacitors shall be outside the outer side edges of the two columns of top electrodes in plan view.

Preferably, the shape of the resist mask 11 for defining capacitors is rectangle that satisfies the above three conditions. However, the four corners of the same sometimes curve as shown in FIG. 2A caused by lack of a contrast at the time of photolithography.

Subsequently, the $IrO_2$ film 5 is patterned using the resist mask 11 for defining capacitors, and the resist mask 11 for defining capacitors is removed thereafter. By the patterning using the resist mask 11 for defining capacitors, the region to form the ferroelectric capacitor is substantially defined.

Figure 3A:
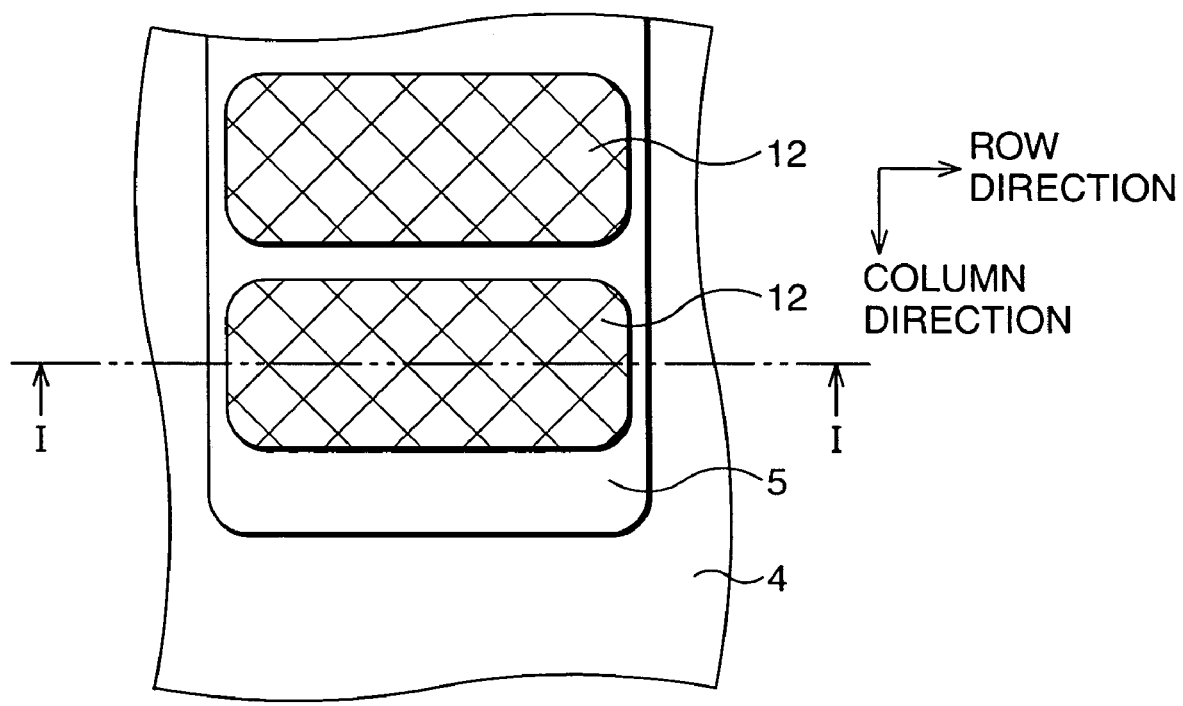
FIGS. 3A and 3B are the top view and the sectional view respectively showing the method for fabricating a ferroelectric memory having ferroelectric capacitors following FIGS. 2A and 2B.
Figure 3B:
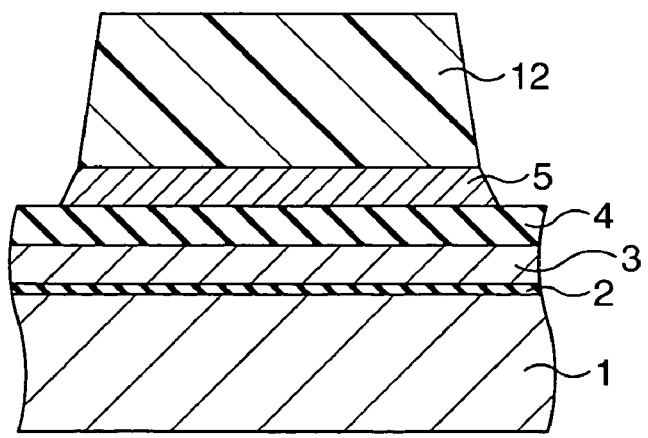

Next, as shown in FIGS. 3A and 3B, a plurality of first resist masks 12 are formed on the $IrO_2$ film 5. At this time, the shape and size of the respective first resist masks 12 shall satisfy the following three conditions.

(1) Firstly, the respective first resist masks 12 shall cover both the two top electrodes composing two pieces of memory cells adjacent to each other in the row direction and entire region between these top electrodes.

(2) Secondly, both the end portions in the row direction of the respective first resist masks 12 shall be outside the outer side edges of the two top electrodes and inside the exposed portion of the $IrO_2$ film 5.

(3) Thirdly, both the end portions in the column direction of the respective first resist masks 12 shall form a straight line that substantially matches with the both sides extending in the row direction of the two top electrodes. More specifically, the both the end portions of the respective first resist masks 12 are defined to be outside the both sides of the top electrode to the extent that the end portions of the respective first resist masks 12 are retreated in a later-described etching process.

Preferably, the shape and size of the first resist masks 12 is rectangle that satisfies the above three conditions. However, the four corners of those sometimes curve as shown in FIG. 3A caused by lack of a contrast at the time of photolithography.

Figure 4A:
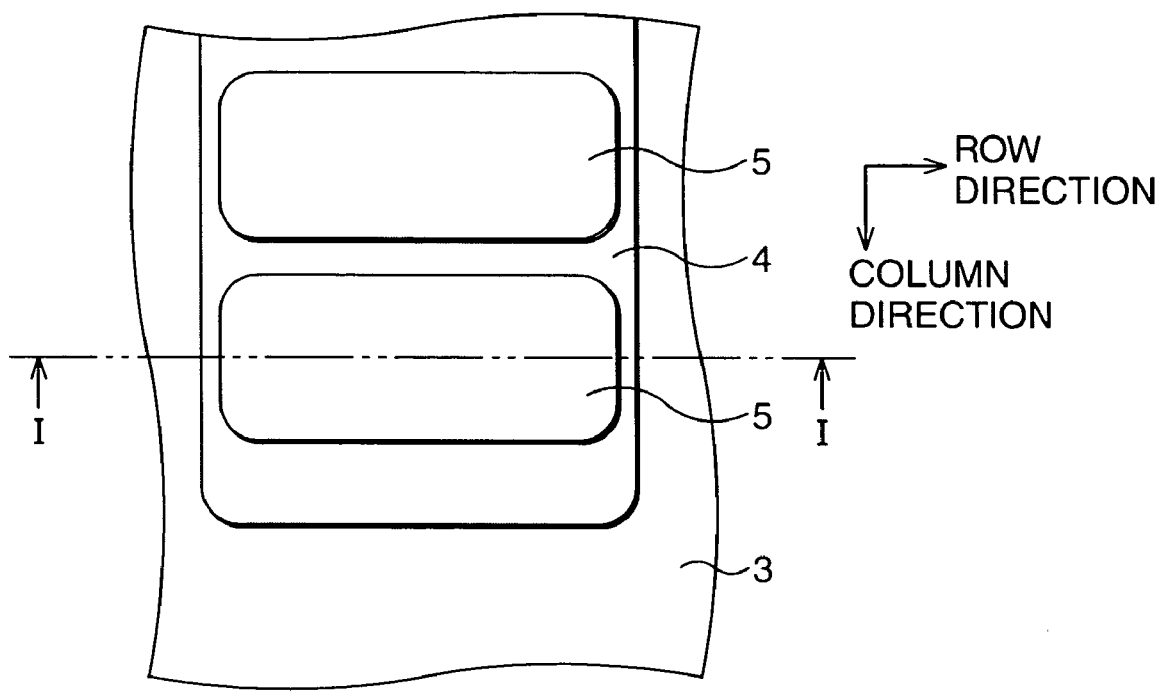
FIGS. 4A and 4B are the top view and the sectional view respectively showing the method for fabricating a ferroelectric memory having ferroelectric capacitors following FIGS. 3A and 3B.
Figure 4B:
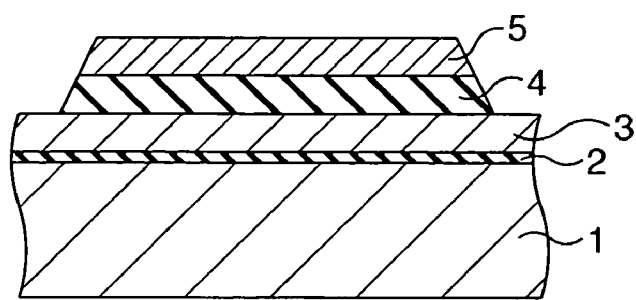

Subsequently, the PZT film 4 and the $IrO_2$ film 5 are etched using the first resist masks 12, and the first resist masks 12 are removed thereafter, as shown in FIGS. 4A and 4B. In this etching, an inductively coupled plasma etching apparatus is in use, the temperature in a wafer stage is set at 25° C., the flow rate of $Cl_2$ gas is set to 10 ml/minute, the flow rate of Ar gas is set to 40 ml/minute, the source power is set to 1400 W (13.56 MHz), the bias power is set to 800 W (400 kHz), and the degree of vacuum is set to 0.5 (pa). Further, this etching shall be finished when the portion of the PZT film 4 exposed from the $IrO_2$ film 5 has been removed and a predetermined amount of overetching has been performed.

When the etching is performed under such conditions, the patterning of the exposed portion of the $IrO_2$ film 5 makes progress simultaneously with the patterning of the PZT film 4. As a result, as shown in FIGS. 4A and 4B, the $IrO_2$ film 5 remains in the region that was covered by the first resist masks 12, the PZT film 4 is exposed from the region of the $IrO_2$ film 5 that was exposed, and the Pt film 3 is exposed in the surrounding area of the PZT film 4.

Incidentally, the PZT film 4 exposed from the region covered only by the IrO$_2$ film 5 is also etched slightly at the time of the overetching.

It should be noted that this etching is preferably performed by retreating the first resist masks 12 in the horizontal direction. This is to prevent the leak caused between the top electrode and a bottom electrode by conductive substances (deposits) adhered to the side surfaces of the first resist masks 12 and the IrO$_2$ film 5 during the etching. Specifically, when there is no retreat of the first resist mask 12, the conductive substances possibly remain on the side surface and the like of the IrO$_2$ film 5. However, with the retreat of the first resist masks 12 intended for etching ferroelectric films, the IrO$_2$ film 5 is also retreated, so that the conductive substances can be removed at all times. Then, the amount to retreat the first resist mask 12 shall be the amount of the first resist mask 12 substantially protruding from the side edge extending in the row direction of the top electrode to be formed. The amount of retreating the resist film can be adjusted, as an example, by changing the ratio of gas flow rates of chlorine to argon when the etching is performed using chlorine and argon as an etching gas, an inductively coupled plasma as a plasma source, and a apparatus applying a low-frequency bias at 400 kHz to the wafer side.

By performing such an etching, the IrO$_2$ film 5 also retreats together with the retreat of the first resist masks 12 as described above, so that the size of the IrO$_2$ film 5 in the column direction comes to substantially the same as the design size of the top electrode. As a result, even if the curbed portions exist in the first resist masks 12 as shown in FIG. 3A, it is possible to prevent the top electrode from becoming smaller than the design size in view of the size in the column direction.

Figure 5A:
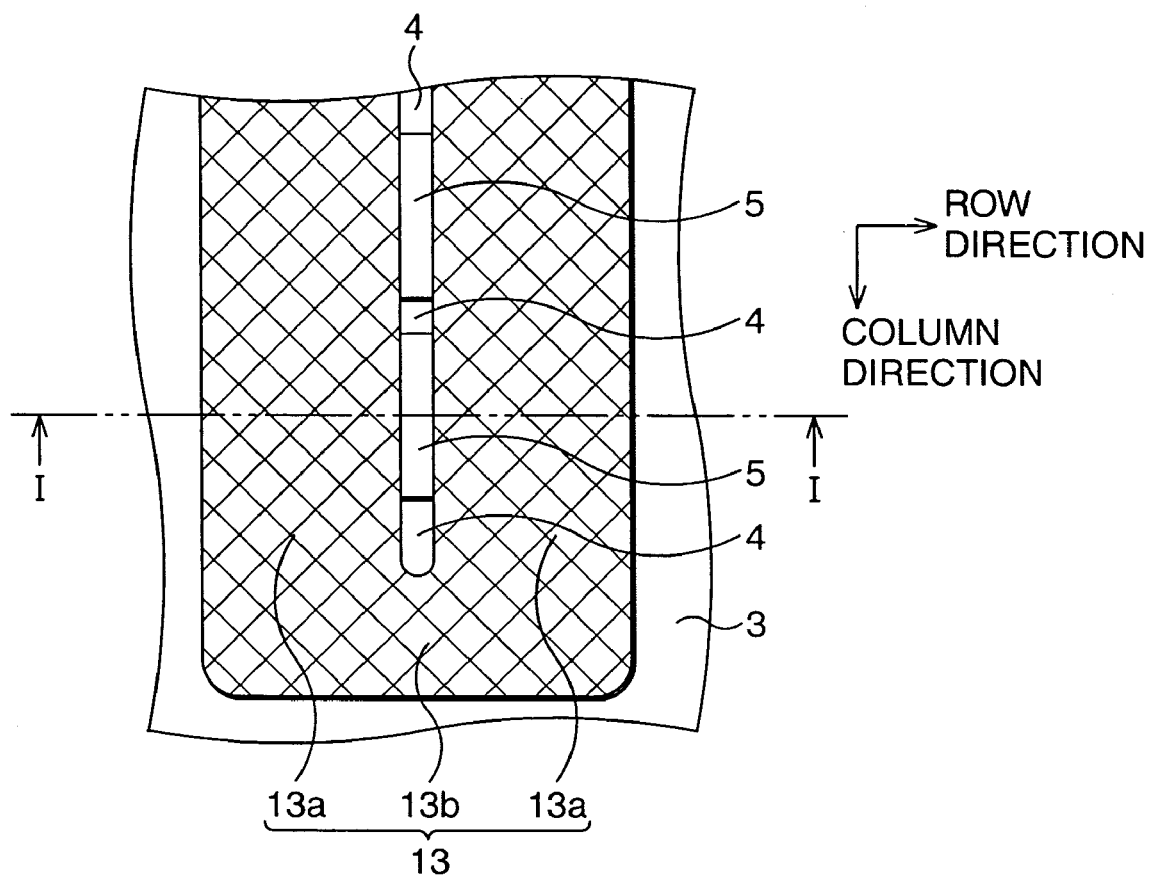
FIGS. 5A and 5B are the top view and the sectional view respectively showing the method for fabricating a ferroelectric memory having ferroelectric capacitors following FIGS. 4A and 4B.
Figure 5B:
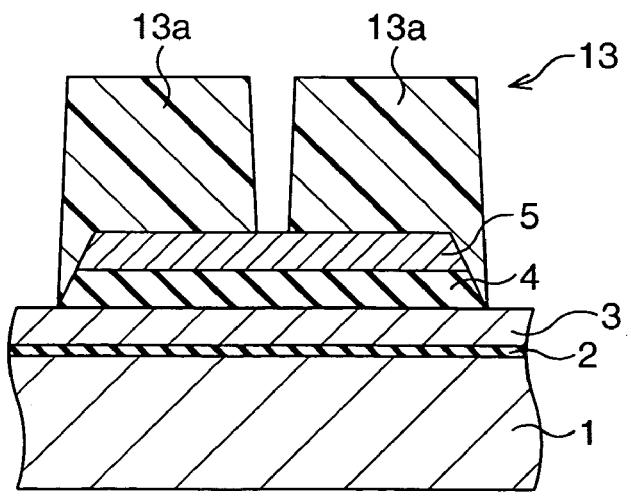

Subsequently, as shown in FIG. 5A and FIG. 5B, a second resist mask 13 is formed on the Pt film 3, the PZT film 4, and the IrO$_2$ film 5. At this time, the shape and size of the second resist mask 13 is a "U" shape that satisfies the following five conditions.

(1) Firstly, as to the column direction of the memory cell arrays, the second resist mask 13 shall cover all the two columns of top electrodes composing two columns of memory cells and all the region between the top electrodes adjacent to each other in the respective columns. Specifically, there exist two parallel portions 13a extending in parallel with each other in the column direction.

(2) Secondly, as to the row direction of the memory cell arrays, the end portions on the mutually confronting sides of the respective parallel portions 13a shape straight lines that substantially match with the inner side edges of the two top electrodes adjacent to each other in plan view. More specifically, the end portion of the second resist mask 13 will be retreated in the later-described etching process, therefore, the positions of the end portions of the parallel portions 13a are set outside the inner side edges of the top electrodes to the extent of the retreat amount.

(3) Thirdly, as to the row direction of the memory cell arrays, the mutually distant end portions of the respective parallel portions 13a shape straight lines that substantially match with the outer side edges of the two top electrodes adjacent to each other in plan view. More specifically, the end portion of the second resist mask 13 will be retreated in the later-described etching process, therefore, the positions of the end portions of the parallel portions 13a are set outside the outer side edges of the top electrodes to the extent of the retreat amount.

(4) Fourthly, the second resist mask 13 shall cover at least a part of the Pt film 3 with the continuing portion of the respective parallel portions 13a. Specifically, a connecting portion 13b connecting the parallel portions 13a with each other shall exist on the Pt film 3.

(5) Fifthly, the connecting portion 13b shall be provided at a position distant from the IrO$_2$ film 5.

Figure 6A:
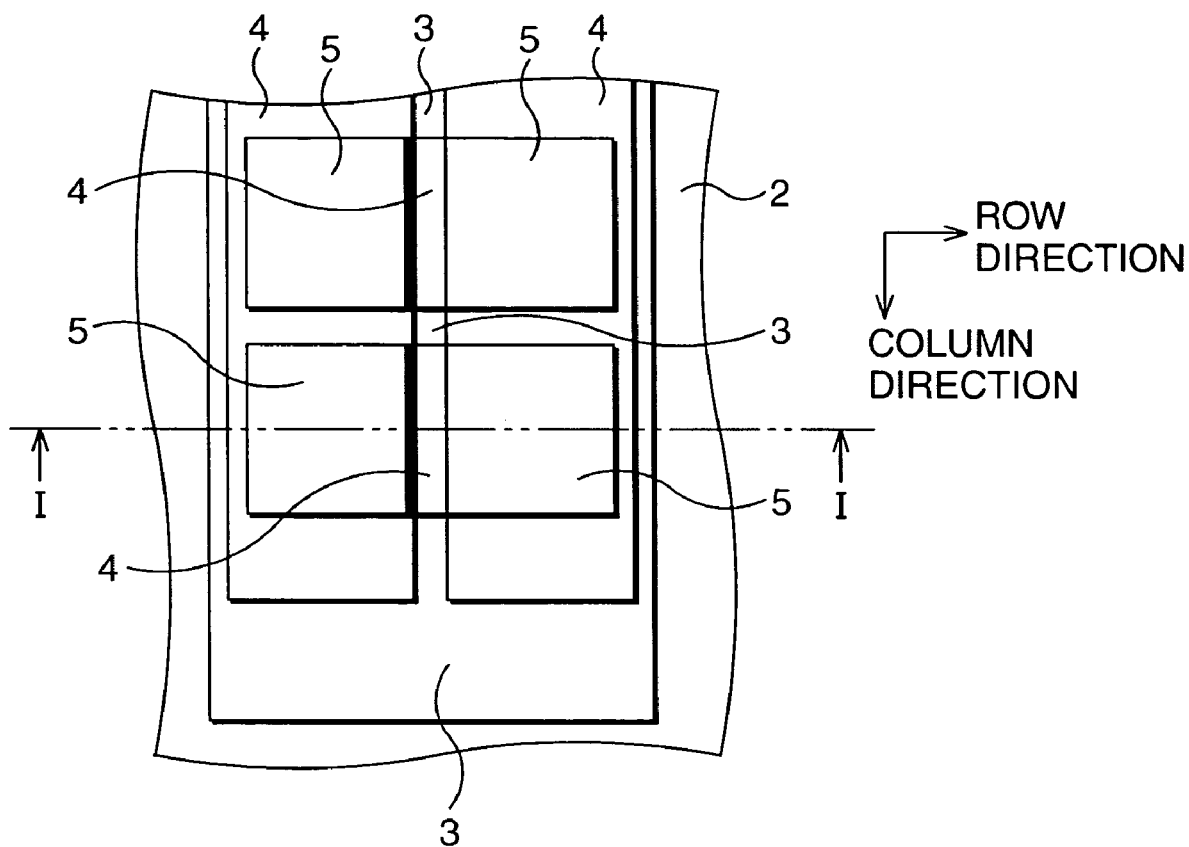
FIGS. 6A and 6B are the top view and the sectional view respectively showing the method for fabricating a ferroelectric memory having ferroelectric capacitors following FIGS. 5A and 5B.
Figure 6B:
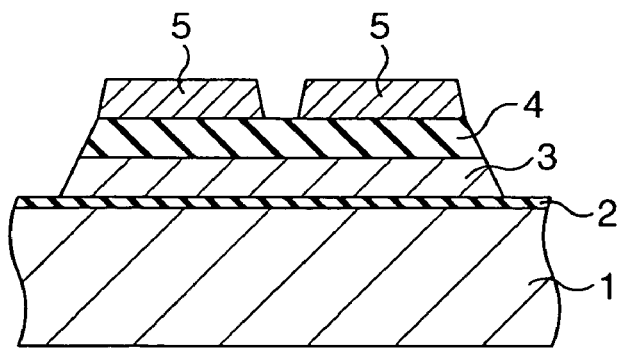

Subsequently, the Pt film 3, the PZT film 4, and the IrO$_2$ film 5 are etched using the second resist mask 13, and the second resist mask 13 is removed thereafter as shown in FIGS. 6A and 6B. In this etching, the inductively coupled plasma etching apparatus is in use, the temperature in a wafer stage is set at 25° C., the flow rate of Cl$_2$ gas is set to 25 ml/minute, the flow rate of Ar gas is set to 25 ml/minute, the source power is set to 1400 W (13.56 MHz), the bias power is set to 800 W (400 kHz), and the degree of vacuum is set to 0.5 (Pa). Further, this etching shall be finished when the portion of the PZT film 4 exposed from the Pt film 3 has been removed and a predetermined amount of overetching has been performed.

When an etching is performed under such conditions, the patterning of the exposed portions of the PZT film 4 and the IrO$_2$ film 5 makes progress simultaneously with the patterning of the Pt film 3. As a result, as shown in FIGS. 6A and 6B, the IrO$_2$ film 5 remains only in the regions that were covered by the second resist mask 13. Specifically, each of the insular IrO$_2$ films 5 is divided into two, respectively. Further, the PZT film 4 is exposed from the region where the IrO$_2$ film 5 was exposed, the Pt film 3 is exposed from the region where the PZT film 4 was exposed, and the Al$_2$O$_3$ film 2 is exposed in the surrounding area of the Pt film 3. Of the remaining Pt film 3, the portions that were covered by the parallel portions 13a come to the bottom electrodes and also plate lines, and a portion that was covered by the connecting portion 13b comes to a contact part of the plate lines. Incidentally, the Pt film 3 is also etched slightly at the time of the overetching. Further, depending on conditions, in the exposed region of the PZT film 4, there is sometimes a case where the PZT film 4 is just thinned without exposing any Pt film 3, however, the case does not trigger any problem.

It should be noted that the second resist mask 13 is preferably etched by being retreated in the horizontal direction also in this etching. By performing such an etching, a leak due to the adhesion of conductive substances can be prevented in the same manner as in the etching using the first resist masks 12. In addition, the amount to retreat the second resist mask 13 shall be the amount of the second resist mask 13 substantially protruding from the side edge extending in the column direction of the top electrode to be formed. By performing such an etching, together with the retreat of the second resist mask 13, the IrO$_2$ film 5 is gradually exposed from the side of the second resist mask 13, and the exposed portion is also subject to the etching. As a result, as shown in FIG. 4A, even if the IrO$_2$ film 5 has curved portions, the curved portions are removed, and, as shown in FIG. 6A, the top electrode formed of the IrO$_2$ film 5 actually having the same size and shape (rectangle) as of the design can be obtained.

In the above-described manner, there is formed the ferroelectric capacitor having the top electrode formed of the IrO$_2$ film 5, the capacitor insulation film formed of the PZT film 4, and the bottom electrode formed of the Pt film 3. The Pt film 3 functions not only as the bottom electrode, but also as a plate line, as will be described later.

After that, as shown in FIGS. 7A and 7B, an Al$_2$O$_3$ film 6 covering the ferroelectric capacitors is formed as a protective film, and further an interlayer insulation film 7 is formed over the entire surface. With the $Al_2O_3$ film 6 being a protective film, the ferroelectric capacitors can be prevented from degrading due to hydrogen diffusion from the lateral surfaces or so forth. Subsequently, contact holes reaching to high-concentration source/drain diffusion layers 35 of transistors 41 are formed through the interlayer insulation film 7, the $Al_2O_3$ film 6, and the interlayer insulation film 1. Then, a contact plug 8 is buried in the contact hole. Further, contact holes intended for wiring and reaching to the $IrO_2$ film 5 are formed through the interlayer insulation film 7 and the $Al_2O_3$ film 6. Then, wirings 9 and a bit wiring 10 connected through the contact holes to the $IrO_2$ film 5 and also the contact plug 8 are formed.

Further, as shown in FIG. 8, a contact hole for plate line reaching to the Pt film 3 is formed in the interlayer insulation film 7 and so forth, a contact plug 15 is buried in the contact hole, a wiring connected to a constant voltage source to supply the plate line (Pt film 3) with constant voltage is formed thereon, and the wiring and the contact plug 15 are connected.

Then, a protective film and so forth are formed to complete the ferroelectric memory.

Further, as shown in FIGS. 7A and 7B, the ferroelectric transistor 41 formed on the surface of the semiconductor substrate 40 has a gate insulation film 31, a gate electrode 32, a cap film 33, a sidewall insulation film 34, the high-concentration source/drain diffusion layers 35, and low-concentration source/drain diffusion layers 36. Moreover, an element active region in which the ferroelectric transistors are formed is isolated by element isolation insulation films 37.

Figure 9:
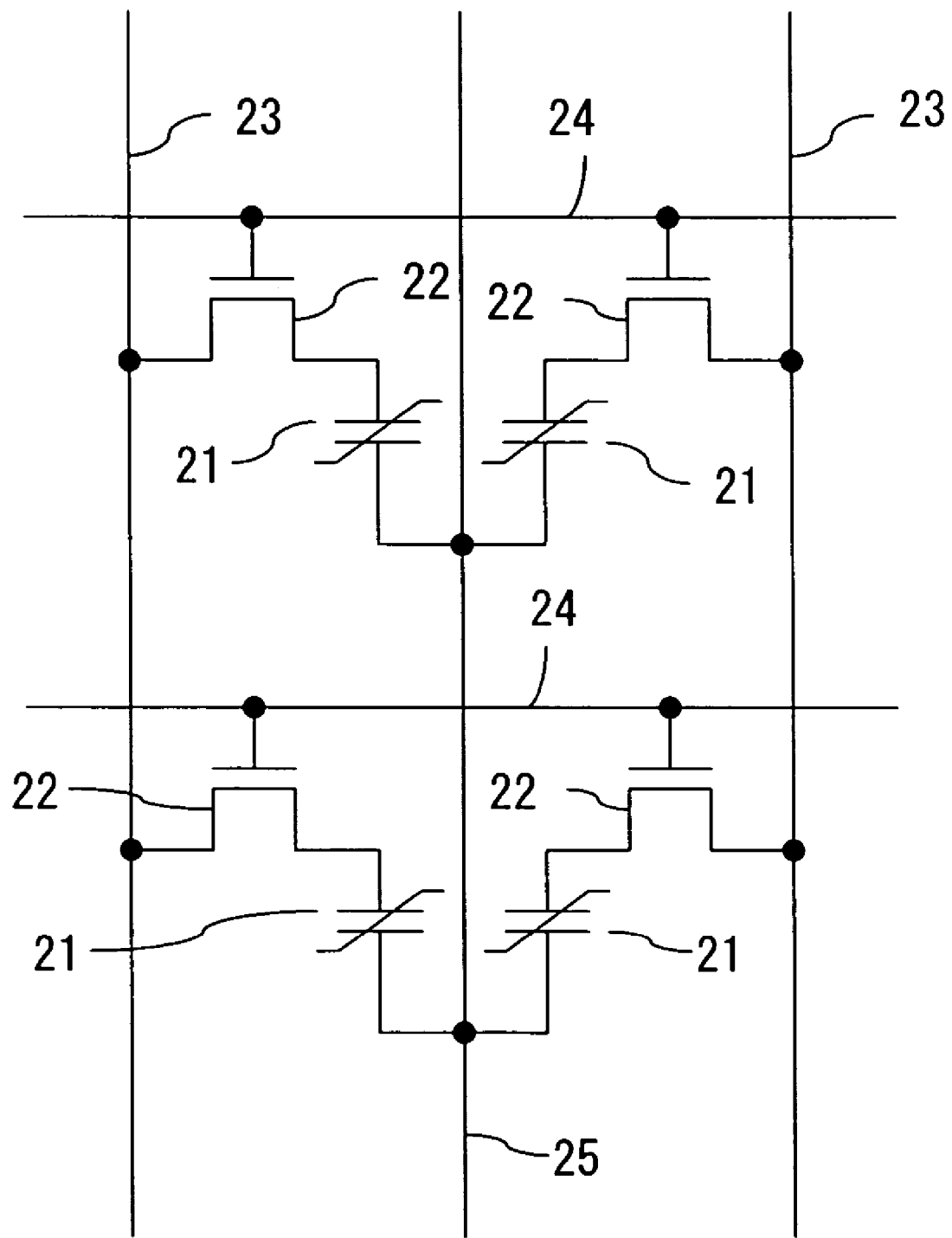
FIG. 9 an equivalent circuit diagram showing the configuration of the ferroelectric memory.
Figure 10A:
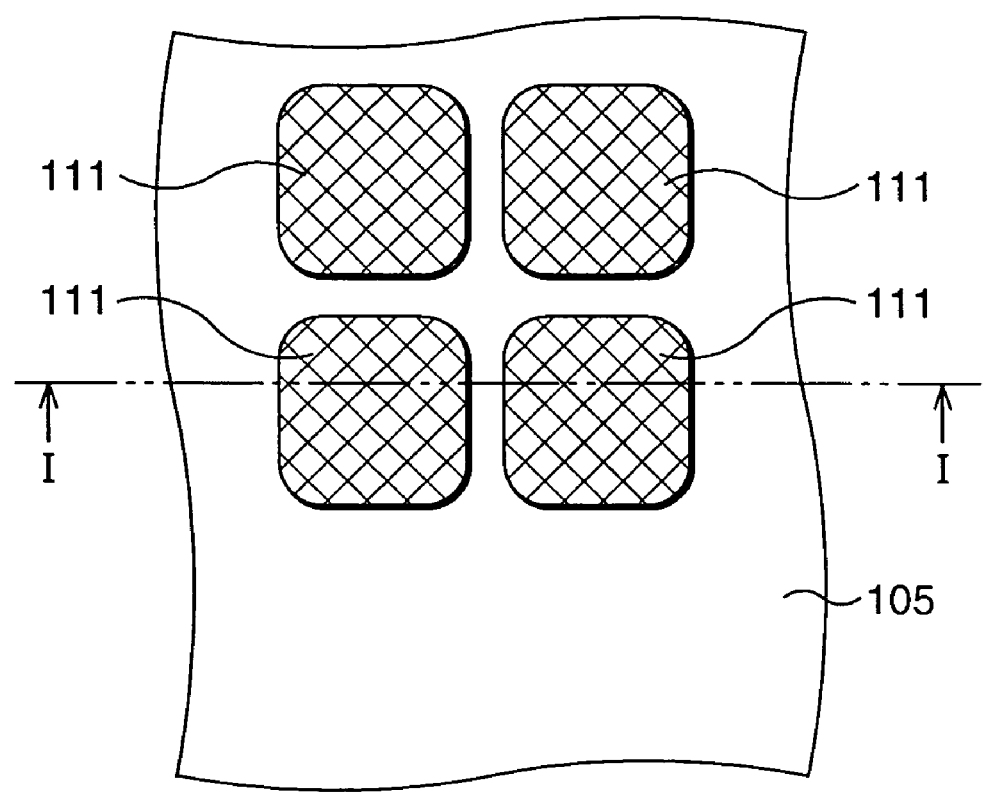
FIGS. 10A and 10B are a top view and a sectional view respectively showing a conventional method for fabricating a ferroelectric memory having ferroelectric capacitors.
Figure 10B:
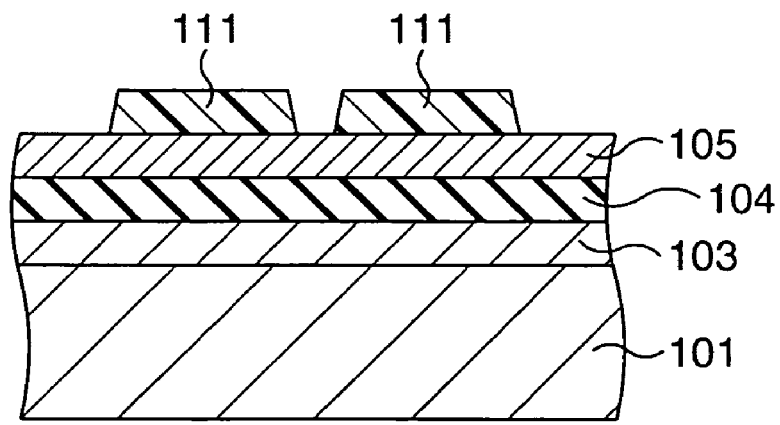
Figure 11A:
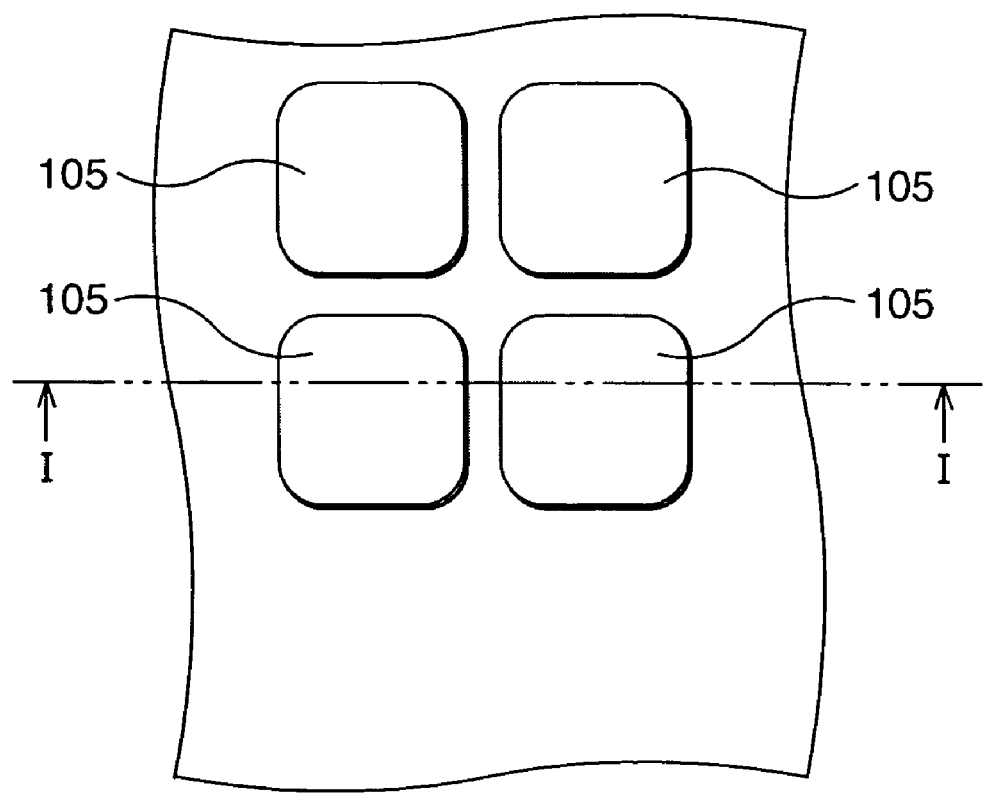
FIGS. 11A and 11B are the top view and the sectional view respectively showing the conventional method for fabricating a ferroelectric memory having ferroelectric capacitors following FIGS. 10A and 10B.
Figure 11B:
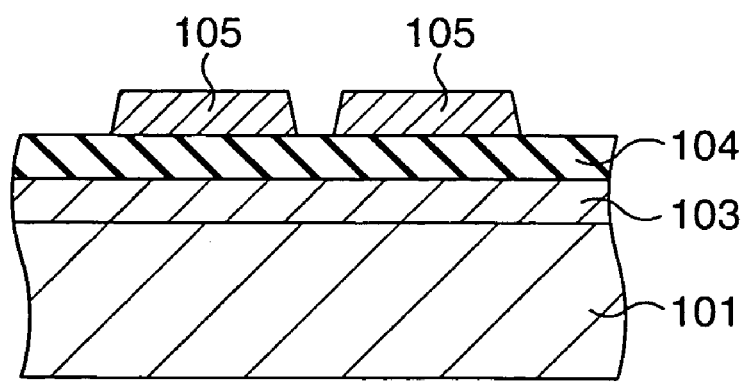
Figure 12A:
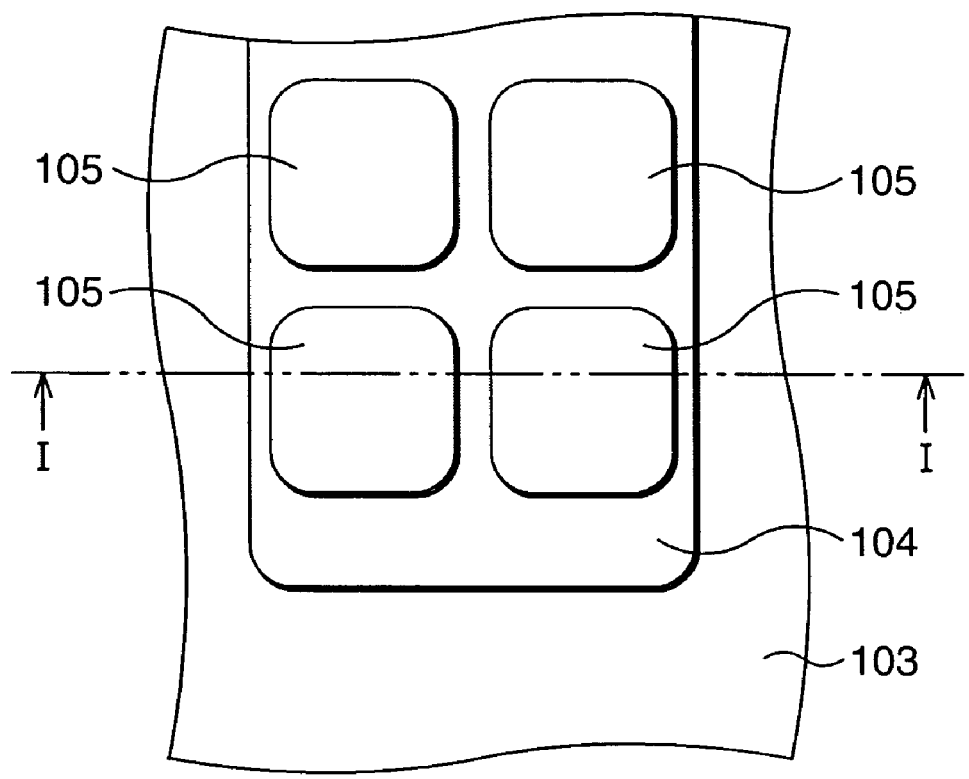
FIGS. 12A and 12B are the top view and the sectional view respectively showing the conventional method for fabricating a ferroelectric memory having ferroelectric capacitors following FIGS. 11A and 11B.
Figure 12B:
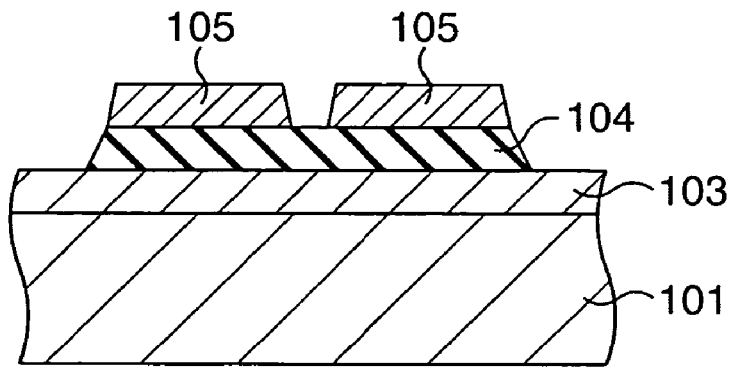
Figure 13A:
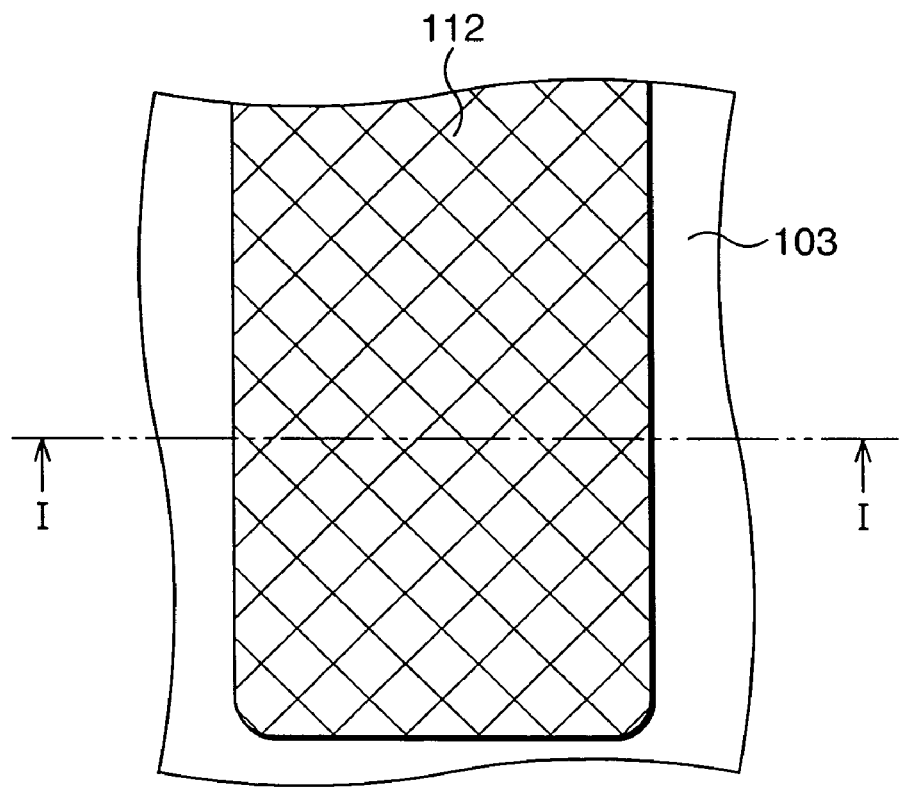
FIGS. 13A and 13B are the top view and the sectional view respectively showing the conventional method for fabricating a ferroelectric memory having ferroelectric capacitors following FIGS. 12A and 12B.
Figure 13B:
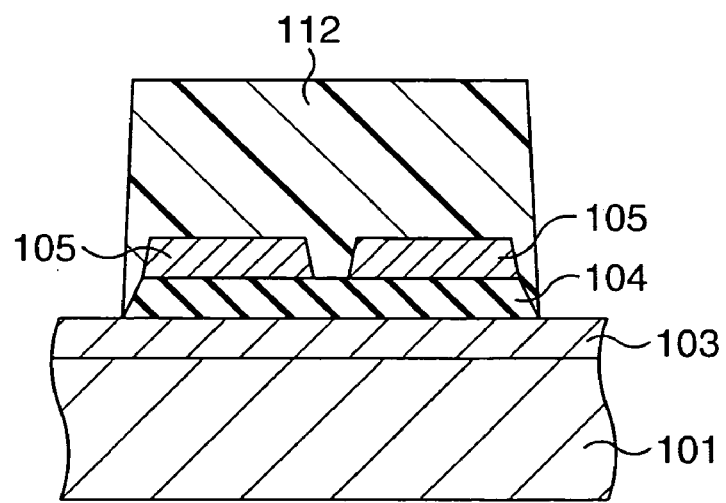
Figure 14A:
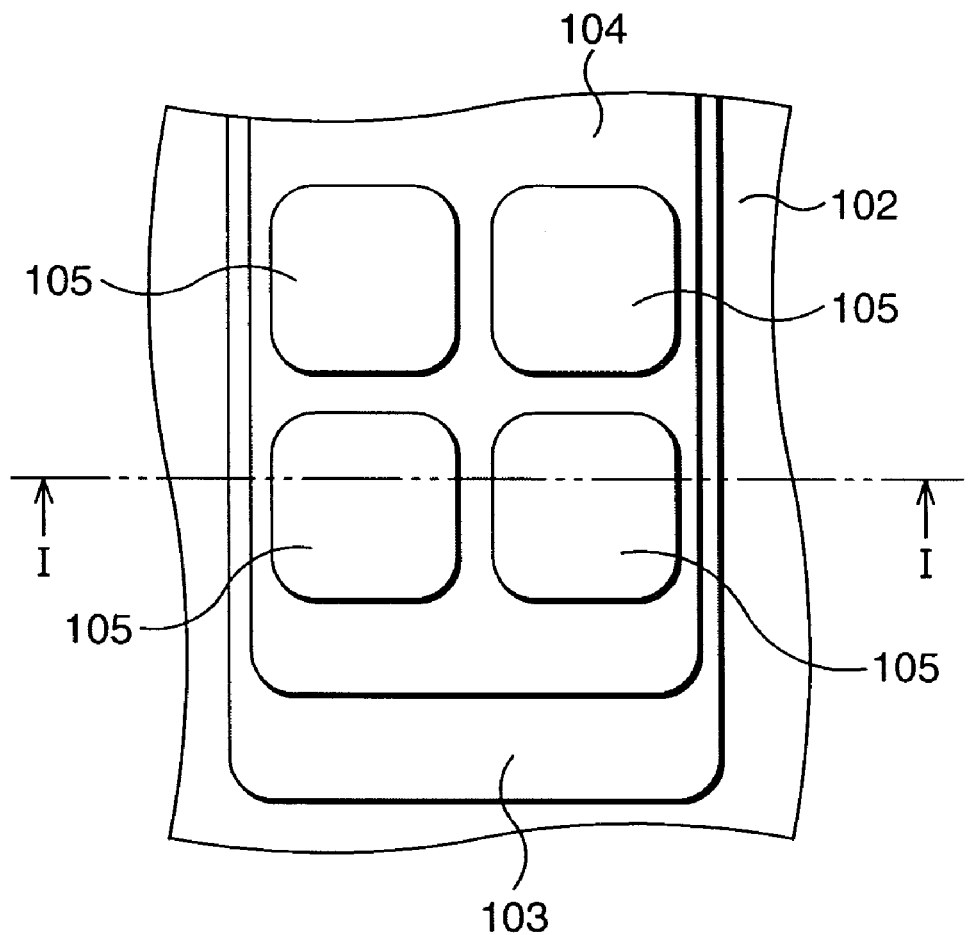
FIGS. 14A and 14B are the top view and the sectional view respectively showing the conventional method for fabricating a ferroelectric memory having ferroelectric capacitors following FIGS. 13A and 13B.
Figure 14B:
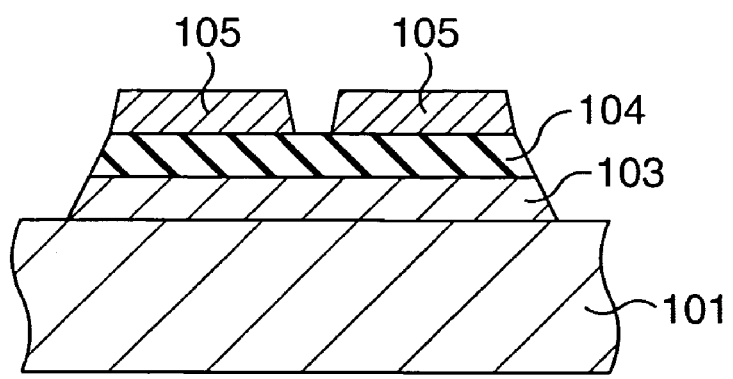

FIG. 9 is an equivalent circuit diagram showing the configuration of the ferroelectric memory fabricated as described above. A ferroelectric capacitor 21 in FIG. 9 corresponds to the ferroelectric capacitor having the Pt film 3, the PZT film 4, and the $IrO_2$ film 5. A MOS transistor 22 corresponds to the ferroelectric transistor 41. A bit line 23 corresponds to the bit wiring 10. A word line 24 corresponds to the gate electrode 32. A plate line 25 corresponds to the Pt film 3.

According to such a fabricating method, a top electrode having the design size and design area can be formed. Accordingly, a highly-integrated and wide-area top electrode can be obtained. Therefore, for example, when it is formed from an i-ray resist of a square of 1 μm side in plan view, it is possible to increase the capacitance to the extent only of the capacitance for the increased area of the top electrode (approximately 10%) as compared to the conventional fabricating method.

Furthermore, even when it is required to thin the bottom electrode due to constraints such as a required property of the capacitor and the like, according to the present embodiment, the $Al_2O_3$ film 2 is formed as a protective film between the Pt film 3 to be the bottom electrode and the interlayer insulation film 1, so that the bottom electrode can be formed thinly while inhibiting the etching of the interlayer insulation film 1. Specifically, the etching rate of the $Al_2O_3$ film 2 is lower than that of the Pt film 3, therefore the Pt film 3 and the like can be etched surely while inhibiting the etching of the interlayer insulation film 1 even if the Pt film 3 should be formed thinly.

It should be noted that the thicknesses and etching conditions of the respective films are not limited to those described above. However, as to the etching using the first resist mask 12, the thicknesses and etching conditions of the respective films are preferably defined such that the portion of the $IrO_2$ film 5 that is exposed from the first resist masks 12 has been sufficiently etched, that is, the etching of the $IrO_2$ film 5 has been completed, when the portion of the PZT film 4 that is exposed from the $IrO_2$ film 5 is overetched.

As a setting of the etching conditions, for example, it is possible to increase the etching rate of the $IrO_2$ film 5 with respect to the etching rate of the PZT film 4 by bringing the etching conditions toward those that exhibit a strong sputtering effect. For instance, the increase in the ratio of the Ar gas, or the increase in ion energy by increasing the bias power, or the like can bring the etching conditions toward those that exhibit a strong sputtering effect. Further, conducting an adjustment being contrary thereto can increase the etching rate of the PZT film 4 with respect to the etching rate of the $IrO_2$ film 5.

Further, as to the etching using the second resist mask 13, for example, the thicknesses and etching conditions of the respective films are preferably defined such that the portion of the $IrO_2$ film 5 that is exposed from the second resist mask 13 has been sufficiently etched, that is, the etching of the $IrO_2$ film 5 has been completed when the portion of the Pt film 3 that is exposed from the PZT film 4 is overetched. Note that, at this time, as described above, the portion of the PZT film 4 that is exposed from the $IrO_2$ film 5 is not necessary be removed completely.

Furthermore, in the above-described embodiment, the Pt film 3, which has strong catalysis, is used as a material film for the bottom electrode (first conductive film), whereas when the Pt film 3 is exposed widely, the moisture or the like in the interlayer insulation film 7, which is formed thereafter, reaches to the Pt film 3 to be decomposed into hydrogen and so forth backed by the catalysis of the Pt film 3. As a result, there is a possibility that the PZT film 4 is reduced and thereby be degraded. Therefore, it is preferable to set the film thicknesses, the etching conditions, and the etching amounts of the respective films so as not to expose the Pt film 3 as much as possible. In the above-described embodiment, the etching is performed under such conditions. Further, this is not limited to the case using the Pt film 3, but is similarly applicable to the cases where the other material having strong catalysis is used as the material film of the bottom electrode.

Incidentally, it is relatively difficult to chemically etch the $IrO_2$ film 5 and the Pt film 3, and thereby difficult is the adjustment of etching selectivity by changing the etching conditions, however, the adjustment is effective by changing the film thickness. Notwithstanding the above, even if the adjustment is made by changing the film thickness, when it is necessity to thin the bottom electrode on the back of the constraints such as the required capacitor property or the like, it is preferable to form a protective film having relatively slower etching rate such as the $Al_2O_3$ film 2, as in the above embodiment.

Further, in the above-described embodiment, the patterning of the PZT film 4 and the Pt film 3 is performed simultaneously with the patterning of the $IrO_2$ film 5 being the material film of the top electrode, whereas it is not necessarily be simultaneous. For instance, the patterning of the PZT film 4 and the Pt film 3 may be performed after completing the patterning of the $IrO_2$ film 5.

Furthermore, when patterning the $IrO_2$ film 5, the resist mask is not necessarily be retreated. For instance, the $IrO_2$ film 5 may be patterned using a resist mask that is formed to have substantially the same design width as of the top electrode.

INDUSTRIAL APPLICABILITY

As has been described, according to the present invention, a highly-integrated and wide-area top electrode can be formed with ease. Accordingly, the capacitance per unit area can be improved. As a result, the performance of the ferroelectric capacitors can be improved.

What is claimed is:

1. A method for fabricating a ferroelectric capacitor comprising the steps of:
    forming a first conductive film, a ferroelectric film, and a second conductive film sequentially on a base film; and
    patterning the second conductive film, by etching the second conductive film using a plurality of masks different from each other, to be shaped into a rectangular planar shape of a top electrode having a first pair of parallel sides with a first designed length in a first direction and a second pair of parallel sides with a second designed length in a second direction perpendicular to the first direction,
    wherein a first mask of the different masks, in plan view, has a first masking shape to etch the second conductive film in the first direction along the first pair of parallel sides of the rectangular planar shape and includes a first portion covering a region of the second conductive film to form the top electrode, and
    a second mask of the different masks, in plan view, has a second masking shape to etch the second conductive film in the second direction along the second pair of parallel sides of the rectangular shape and includes a second portion covering the region of the second conductive film to form the top electrode.

2. The method for fabricating a ferroelectric capacitor according to claim 1,
    wherein a first width of the first masking shape is substantially the same as the second designed length in the second direction of the top electrode.

3. The method for fabricating a ferroelectric capacitor according to claim 1,
    wherein a second width of the second mask masking shape is substantially the same as the first designed length in the first direction of the top electrode.

4. The method for fabricating a ferroelectric capacitor according to claim 1,
    wherein a first width of the first masking shape is narrowed when the second conductive film is etched using the first mask.

5. The method for fabricating a ferroelectric capacitor according to claim 4,
    wherein the first width of the first masking shape is larger than the the second designed length in the second direction of the top electrode, and
    the first width of the first masking shape is narrowed to the second designed length in the second direction of the top electrode when the second conductive film is etched using the first mask.

6. The method for fabricating a ferroelectric capacitor according to claim 1,
    wherein a second width of the second masking shape is narrowed when the second conductive film is etched using the second mask.

7. The method for fabricating a ferroelectric capacitor according to claim 6,
    wherein the second width of second masking shape is larger than the design size in the first direction of the top electrode, and
    the second width of the portion extending in the second direction is narrowed to the design size in the first direction of the top electrode when the second conductive film is etched using the second mask.

8. The method for fabricating a ferroelectric capacitor according to claim 1,
    wherein said step of patterning the second conductive film includes the steps of:
    patterning the ferroelectric film to have a planar shape of a capacitor insulation film at least by etching the ferroelectric film using the first mask; and
    patterning the first conductive film to have a planar shape of the bottom electrode at least by etching the first conductive film using the second mask.

9. The method for fabricating a ferroelectric capacitor according to claim 1,
    further comprising the step of forming an alumina film on the base film before said step of forming the first conductive film.

10. The method for fabricating a ferroelectric capacitor according to claim 1,
    wherein said step of patterning the second conductive film, the second conductive film is etched using a third mask covering at least a region to form a capacitor insulation film, before performing the etching using the first mask and performing the etching using the second mask.

11. The method for fabricating a ferroelectric capacitor according to claim 10,
    wherein a part of the ferroelectric film is also etched when the second conductive film is etched using the first mask.

12. The method for fabricating a ferroelectric capacitor according to claim 11,
    wherein a part of the ferroelectric film and a part of the first conductive film are also etched when the second conductive film is etched using the second mask.

13. The method for fabricating a ferroelectric capacitor according to claim 10,
    wherein the third mask includes a portion extending in the second direction.

14. The method for fabricating a ferroelectric capacitor according to claim 13,
    wherein two pieces of second masks are used for each of regions of the second conductive film remaining after the etching using the third mask.

15. The method for fabricating a ferroelectric capacitor according to claim 11,
    wherein a condition on the etching of the second conductive film using the first mask is to complete the patterning of the second conductive film when the overetching of the ferroelectric film is completed.

16. The method for fabricating a ferroelectric capacitor according to claim 12,
    wherein a condition on the etching of the second conductive film using the second mask is to complete the patterning of the second conductive film when the overetching of the first conductive film is completed.

17. The method for fabricating a ferroelectric capacitor according to claim 12,
    wherein the second mask includes a portion covering a region to form a connecting portion with a plate line of the first conductive film.

18. The method for fabricating a ferroelectric capacitor according to claim 17, wherein the connecting portion is provided at a position distant from the region remaining after the etching of the second conductive film using the first mask.

19. The method for fabricating a ferroelectric capacitor according to claim 4,
wherein a mixed gas of chlorine and argon is used as an etching gas when the second conductive film is etched using the first mask.

20. The method for fabricating a ferroelectric capacitor according to claim 6,
wherein a mixed gas of chlorine and argon is used as an etching gas when the second conductive film is etched using the second mask.

* * * * *